(12) United States Patent
Won et al.

(10) Patent No.: US 11,257,877 B2
(45) Date of Patent: Feb. 22, 2022

(54) DISPLAY DEVICE

(71) Applicant: LG Display Co., Ltd., Seoul (KR)

(72) Inventors: Sang Hyuk Won, Gimpo-si (KR); Min Joo Kim, Seoul (KR); Jae Won Lee, Goyang-si (KR); Sang Hoon Pak, Seoul (KR); Byong Hoo Kim, Paju-si (KR); Sang Heun Lee, Seoul (KR); Hyang Myoung Gwon, Paju-si (KR); Jeong Hoon Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/095,409

(22) Filed: Nov. 11, 2020

(65) Prior Publication Data

US 2021/0066401 A1  Mar. 4, 2021

Related U.S. Application Data

(63) Continuation of application No. 15/966,321, filed on Apr. 30, 2018, now Pat. No. 10,892,304.

(30) Foreign Application Priority Data

May 8, 2017 (KR) .......................... 10-2017-0057291

(51) Int. Cl.
*H01L 27/32* (2006.01)
*H01L 51/52* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ...... G06F 3/0412; G06F 3/044; G06F 3/0443; G06F 3/0446; H01L 27/322;
(Continued)

(56) References Cited

U.S. PATENT DOCUMENTS 9,117,778 B2  8/2015 Yanagawa et al.
9,356,087 B1*  5/2016 Lee ..................... H01L 51/5237
(Continued)

FOREIGN PATENT DOCUMENTS

CN  103855188 A  6/2014
CN  204883640 U  12/2015
(Continued)

OTHER PUBLICATIONS

Extended European Search Report dated Jul. 27, 2018 for EP 18171210.0.
(Continued)

*Primary Examiner* — Kwin Xie
(74) *Attorney, Agent, or Firm* — Polsinelli PC

(57) ABSTRACT

Disclosed is a display device capable of reducing the thickness and the weigh thereof. In an organic light-emitting diode display device having a touch sensor, a plurality of routing lines, which are connected respectively to a plurality of touch sensors disposed on an encapsulation unit, are disposed on different planes so as to overlap each other and are electrically connected to each other through a plurality of routing contact holes. Thereby, a connection fault between the routing lines is prevented. In addition, through the provision of the touch sensors above the encapsulation unit, a separate attachment process is unnecessary, which results in a simplified manufacturing process and reduced costs.

12 Claims, 17 Drawing Sheets

(51) Int. Cl.
*G06F 3/041* (2006.01)
*G06F 3/044* (2006.01)
*G09G 3/3241* (2016.01)

(52) U.S. Cl.
CPC .......... *G06F 3/0443* (2019.05); *G06F 3/0446* (2019.05); *G09G 3/3241* (2013.01); *H01L 27/322* (2013.01); *H01L 27/3276* (2013.01); *H01L 51/5206* (2013.01); *H01L 51/5221* (2013.01); *G06F 2203/04103* (2013.01); *G06F 2203/04111* (2013.01); *G06F 2203/04112* (2013.01)

(58) Field of Classification Search
CPC .............. H01L 27/323; H01L 27/3276; H01L 51/5206; H01L 51/5221; G09G 3/3241
USPC .................................................. 345/173–174
See application file for complete search history.

(56) References Cited

U.S. PATENT DOCUMENTS

| | | | |
|---|---|---|---|
| 2012/0062481 A1 | 3/2012 | Kim et al. | |
| 2012/0262385 A1 | 10/2012 | Kim et al. | |
| 2014/0152912 A1 | 6/2014 | Lee et al. | |
| 2014/0168109 A1 | 6/2014 | Kang et al. | |
| 2014/0210738 A1 | 7/2014 | Hur | |
| 2014/0240624 A1 | 8/2014 | Misaki | |
| 2014/0267947 A1* | 9/2014 | Yeh | G06F 3/03547 349/12 |
| 2015/0001482 A1 | 1/2015 | Jung | |
| 2015/0091859 A1* | 4/2015 | Rosenberg | G01L 1/146 345/174 |
| 2015/0153873 A1 | 6/2015 | Lee et al. | |
| 2015/0220191 A1* | 8/2015 | Huh | G06F 3/0446 345/173 |
| 2016/0043348 A1* | 2/2016 | Zhang | H01L 27/3258 257/40 |
| 2016/0103537 A1 | 4/2016 | Park et al. | |
| 2016/0126498 A1 | 5/2016 | Kim | |
| 2016/0154499 A1 | 6/2016 | Bae et al. | |
| 2016/0170524 A1 | 6/2016 | Kim et al. | |
| 2016/0218151 A1 | 7/2016 | Kwon et al. | |
| 2016/0328053 A1* | 11/2016 | Veerasamy | G06F 3/0446 |
| 2016/0349905 A1 | 12/2016 | Momma et al. | |
| 2016/0370939 A1* | 12/2016 | Guo | G06F 3/0446 |
| 2016/0378233 A1* | 12/2016 | Huo | G06F 3/0412 345/174 |
| 2017/0069692 A1 | 3/2017 | Lee et al. | |
| 2017/0069962 A1* | 3/2017 | Wilbur | H01Q 1/44 |
| 2017/0090622 A1* | 3/2017 | Badaye | G06F 3/0446 |
| 2018/0059862 A1* | 3/2018 | Zeng | G06F 3/0443 |

FOREIGN PATENT DOCUMENTS

| | | |
|---|---|---|
| CN | 106505088 A | 3/2017 |
| JP | 2010-231533 A | 10/2010 |
| JP | 2011-023558 A | 2/2011 |
| JP | 2014-078198 A | 5/2014 |
| JP | 2014-153791 A | 8/2014 |
| JP | 2014-240998 A | 12/2014 |
| JP | 2016-038697 A | 3/2016 |
| JP | 2016-162305 A | 9/2016 |
| JP | 2016-222526 A | 12/2016 |
| KR | 10-2015-0064281 A | 6/2015 |
| KR | 20160041541 A | 4/2016 |
| KR | 10-2016-0051207 A | 5/2016 |
| KR | 10-2016-0072336 A | 6/2016 |

OTHER PUBLICATIONS

Japanese official action dated Apr. 16, 2019 for Japanese Patent Application 2018-089721.
Office Action dated Dec. 19, 2019 issued in corresponding Korean Application No. 10-2017-0057291 (7 pages).
Chinese Office Action dated Nov. 4, 2020 issued in Patent Application 201810430831.0 w/English Translation (21 pages).
Japanese Office Action dated Nov. 10, 2020 issued in Patent Application No. 2019-186862 (2 pages).
Korean Office Action dated Sep. 23, 2021 issued in corresponding Patent Application No. 10-2021-0044485 (5 pages).

* cited by examiner

DISPLAY DEVICE

CROSS-REFERENCE TO RELATED APPLICATIONS

This application is a continuation of U.S. application Ser. No. 15/966,321, filed Apr. 30, 2018, which claims the benefit of Korean Patent Application No. 10-2017-0057291, filed on May 8, 2017, of which the full disclosures of these applications are incorporated herein by reference for all purposes.

BACKGROUND

Field of the Disclosure

The present disclosure relates to a display device, and more particularly, to a display device and a method of manufacturing the same for achieving a simplified manufacturing process and reduced costs.

Description of the Background

A touchscreen is an input device that allows a user to input a command by selecting a content appearing on a screen of a display device or the like with the human hand or an object. That is, the touchscreen converts a contact position that the human hand or the object directly touches into an electrical signal, and receives the content selected at the contact position as an input signal. The touchscreen may eliminate a separate input device, which is connected to the display device and operates, such as a keyboard or a mouse, and thus the use range thereof is gradually expanding.

Such a touchscreen is generally attached to the front surface of a display panel, such as a liquid crystal display panel or an organic light-emitting diode display panel, via an adhesive. In this case, since the touchscreen is separately manufactured and attached to the front surface of the display panel, the manufacturing process becomes complicated and the costs can be increased due to the addition of such an attachment process.

SUMMARY

Accordingly, the present disclosure is directed to a display device that substantially obviates one or more problems due to limitations and disadvantages of the related art.

The present disclosure has been provided to solve the problems described above, and the present disclosure is to provide a display device and a method of manufacturing the same for achieving a simplified manufacturing process and reduced costs.

Additional advantages and features of the disclosure will be set forth in part in the description which follows and in part will become apparent to those having ordinary skill in the art upon examination of the following or may be learned from practice of the disclosure. The other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light-emitting diode display device having a touch sensor is configured such that a plurality of routing lines, which are connected respectively to a plurality of touch sensors above an encapsulation unit, are disposed on different planes so as to overlap each other and are electrically connected to each other through a plurality of routing contact holes, whereby a connection fault between the routing lines is prevented. In addition, through the provision of the touch sensors above the encapsulation unit, a separate attachment process is unnecessary, which results in a simplified manufacturing process and reduced costs.

In another aspect of the present disclosure, a display device including a light-emitting element disposed on a substrate; an encapsulation unit disposed on the light-emitting element; a plurality of touch sensors disposed over the encapsulation unit; a touch insulation layer disposed on the encapsulation unit; a lower routing line disposed on the touch insulation layer having a plurality of routing contact holes and covering a lateral surface of the encapsulation unit; and an upper routing line disposed on the touch insulation layer along the lower routing line and connected to the lower routing line through the plurality of routing contact holes, wherein the lower routing line and the upper routing line are disposed on different planes and overlap each other.

In a further aspect of the present disclosure, A method of manufacturing a display device including forming a light-emitting element on a substrate; forming an encapsulation unit on the light-emitting element; forming a plurality of touch sensors above the encapsulation unit; and forming a plurality of routing lines connected to the plurality of touch sensors and covering a side surface of the encapsulation unit, wherein the plurality of routing lines are disposed on different planes to overlap each other and is electrically connected to each other through a plurality of routing contact holes.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Hereinafter, aspects according to the present disclosure will be described in detail with reference to the accompanying drawings. Whenever possible, the same reference numbers will be used throughout the drawings to refer to the same or like parts.

Figure 1:
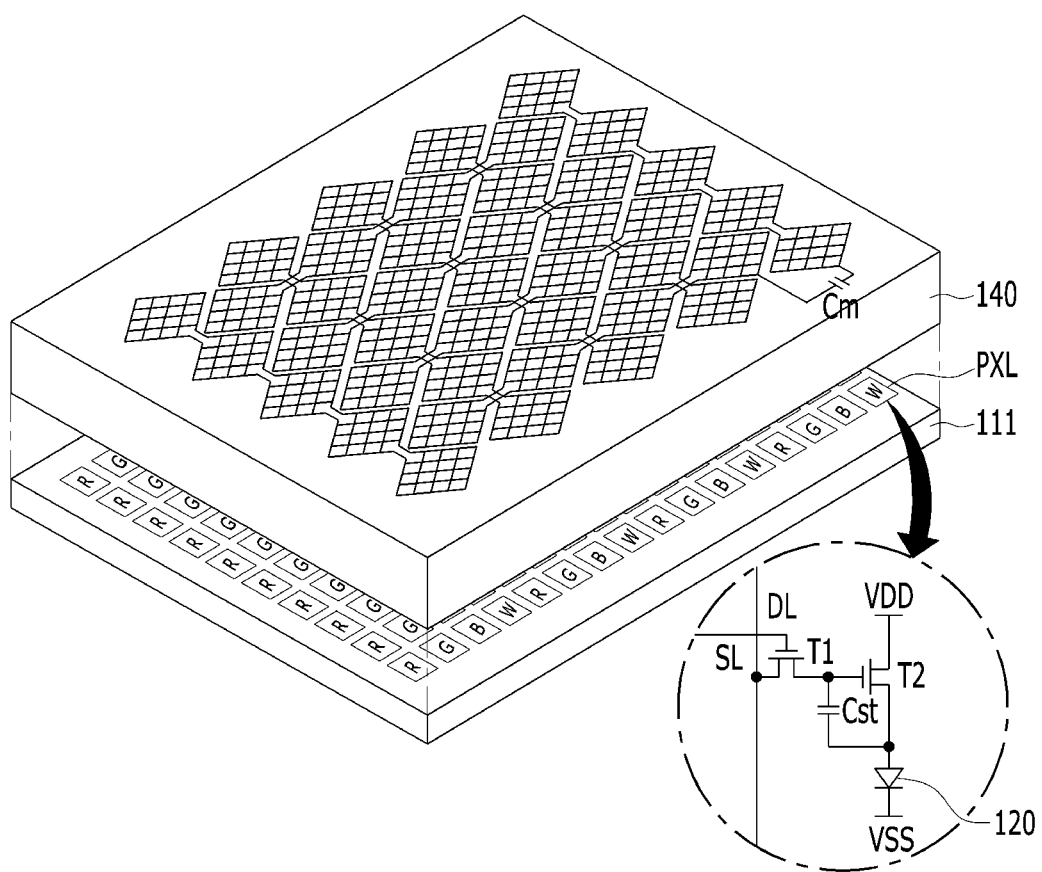
FIG. 1 is a perspective view illustrating an organic light-emitting diode display device having a touch sensor according to the present disclosure.

FIG. 1 is a perspective view illustrating an organic light-emitting diode display device having a touch sensor according to the present disclosure.

Figure 2:
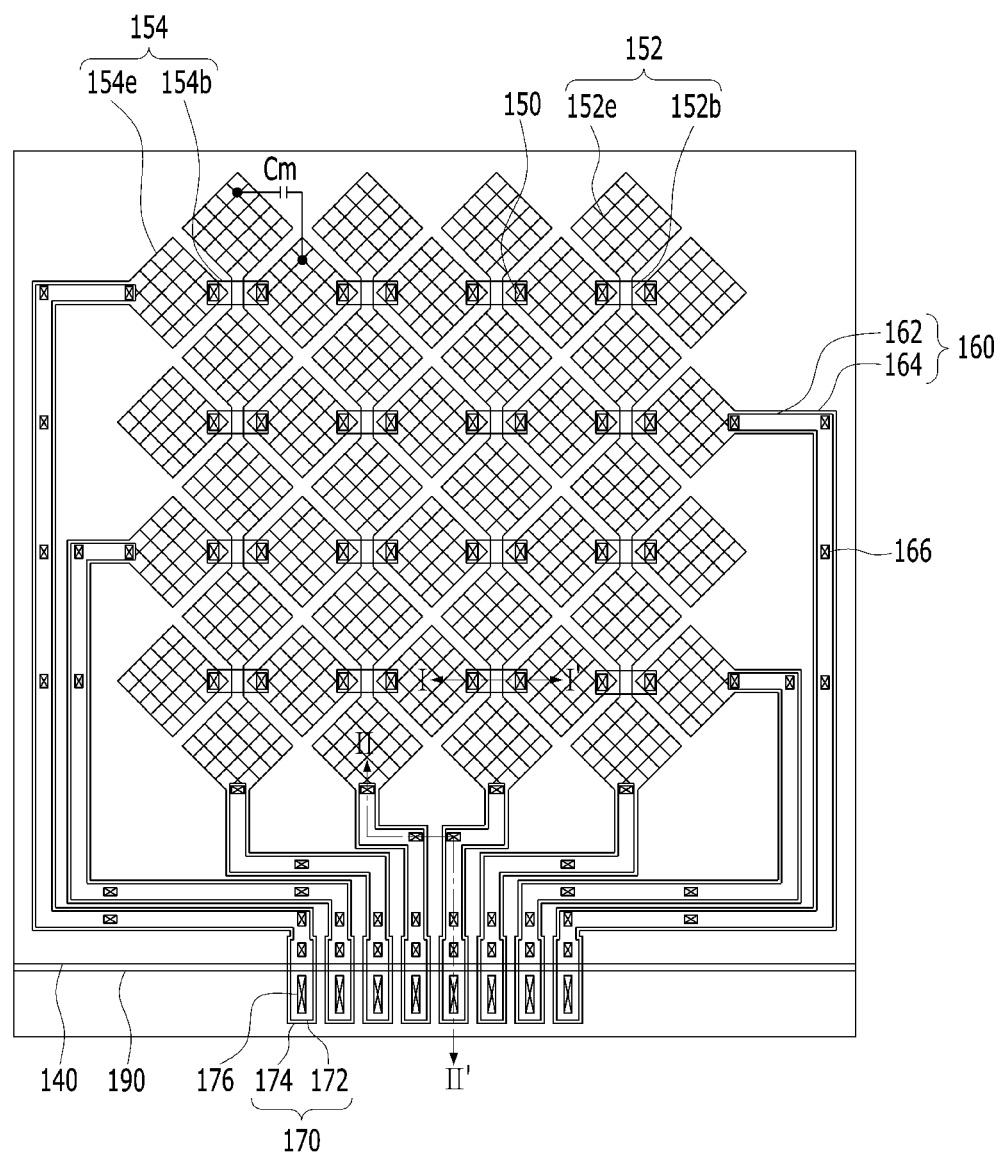
FIG. 2 is a plan view illustrating the organic light-emitting diode display device having the touch sensor illustrated in FIG. 1.

The organic light-emitting diode display device having a touch sensor illustrated in FIG. 1 senses the presence or absence of a touch and a touch position by sensing a variation in mutual capacitance Cm (touch sensor) in response to a user touch via touch electrodes 152e and 154e illustrated in FIG. 2 during a touch period. Then, the organic light-emitting diode display device having a touch sensor illustrated in FIG. 1 displays an image via unit pixels each including a light-emitting element 120. Each unit pixel may include red (R), green (G), and blue (B) subpixels PXL, or may include red (R), green (G), blue (B), and white (W) subpixels PXL.

To this end, the organic light-emitting diode display device illustrated in FIG. 1 includes a plurality of subpixels PXL arranged in a matrix form on a substrate 111, an encapsulation unit 140 disposed on the subpixels PXL, and a mutual capacitance array Cm disposed on the encapsulation unit 140.

Each of the subpixels PXL includes a pixel drive circuit and the light-emitting element 120 connected to the pixel drive circuit.

The pixel drive circuit includes a switching transistor T1, a driving transistor T2, and a storage capacitor Cst.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls current to be supplied from a high-voltage (VDD) supply line to the light-emitting element 120 in response to the data signal supplied to the gate electrode of the driving transistor T2, thereby adjusting the amount of emission of light from the light-emitting element 120. Then, even if the switching transistor T1 is turned off, the driving transistor T2 maintains the emission of light of the light-emitting element 120 by supplying a constant amount of current thereto by a voltage charged in the storage capacitor Cst until a data signal of a next frame is supplied.

Figure 3:
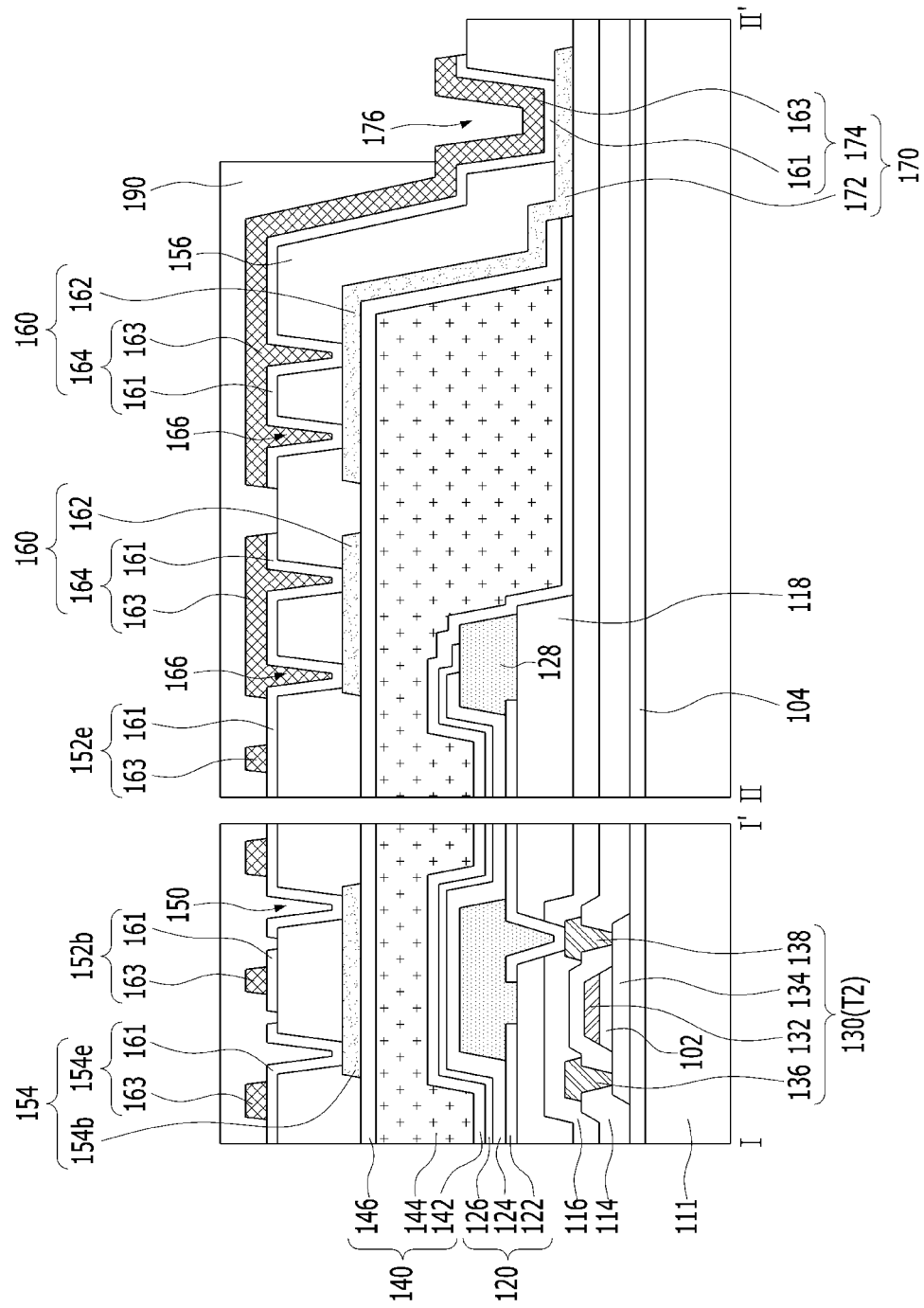
FIG. 3 is a cross-sectional view illustrating the organic light-emitting diode display device having the touch sensor taken along lines "I-I" and "II-II" of FIG. 2.

The driving transistor T2 or 130, as illustrated in FIG. 3, includes a gate electrode 132, a semiconductor layer 134 overlapping the gate electrode 132 with a gate insulation layer 102 therebetween, and source and drain electrodes 136 and 138 formed on an interlayer insulation layer 114 to come into contact with the semiconductor layer 134. Here, the semiconductor layer 134 is formed on a buffer layer 104 using at least one of an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving transistor T2 or 130, which is exposed through a pixel contact hole formed in a protective layer 116.

The light-emitting stack 124 is formed on the anode electrode 122 in a light-emitting area that is defined by a bank 128. The light-emitting stack 124 is formed by stacking a hole-related layer, an organic emission layer, and an electron-related layer on the anode electrode 122 in this order or in the reverse order. In addition, the at least one light-emitting stack 124 may include first and second light-emitting stacks, which face each other with a charge generation layer therebetween. In this case, the organic emission layer of any one of the first and second light-emitting stacks generates blue light, and the organic emission layer of the other one of the first and second light-emitting stacks generates yellow-green light, whereby white light is generated via the first and second light-emitting stacks. Since the white light generated in the light-emitting stack 124 is incident on a color filter located above or below the light-emitting stack 124, a color image may be realized. In addition, colored light corresponding to each subpixel may be generated in each light-emitting stack 124 to realize a color image, without a separate color filter. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode electrode 126 may be formed so as to face the anode electrode 122 with the light-emitting stack 124 therebetween, and is connected to a low-voltage (VSS) supply line.

The encapsulation unit 140 prevents external moisture or oxygen from entering the light-emitting element 120, which is vulnerable to the external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is the uppermost layer. Here, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 111, on which the cathode electrode 126 has been formed, so as to be closest to the light-emitting element 120. The first inorganic encapsulation layer 142 is formed of an inorganic insulation material that is capable of being deposited at a low temperature, such as silicon nitride ($SiN_x$), silicon oxide ($SiO_x$), silicon oxide nitride (SiON), and aluminum oxide ($Al_2O_3$). Thus, since the first inorganic encapsulation layer 142 is deposited under a low-temperature atmosphere, it is possible to prevent damage to the light-emitting stack 124, which is vulnerable to a hightemperature atmosphere, during the deposition process of the first inorganic encapsulation layer 142.

The organic encapsulation layer 144 serves to dampen the stress between the respective layers caused by bending the organic light-emitting diode display device and to increase planarization performance. The organic encapsulation layer 144 is formed using an organic insulation material, such as an acryl resin, epoxy resin, polyimide, polyethylene, and silicon oxycarbide (SiOC).

The second inorganic encapsulation layer 146 is formed so as to cover the upper surface and the side surface of the organic encapsulation layer 144 and the upper surface of the first inorganic encapsulation layer 142 that is exposed by the organic encapsulation layer 144. Thus, since the upper and lower surfaces of the organic encapsulation layer 144 are sealed by the first and second inorganic encapsulation layers 142 and 146, it is possible to minimize or prevent external moisture or oxygen from entering the organic encapsulation layer 144, or to minimize or prevent moisture or oxygen in the organic encapsulation layer 144 from entering the light-emitting element 120. The second inorganic encapsulation layer 146 is formed of an inorganic insulation material, such as silicon nitride ($SiN_x$), silicon oxide ($SiO_x$), silicon oxide nitride (SiON), and aluminum oxide ($Al_2O_3$).

On the encapsulation unit 140, a touch sensing line 154 and a touch driving line 152 are disposed so as to intersect each other with a touch insulation layer 156 therebetween. The mutual capacitance array Cm is formed at the intersection of the touch sensing line 154 and the touch driving line 152. Thus, the mutual capacitance array Cm serves as a touch sensor by storing charges in response to a touch driving pulse supplied to the touch driving line 152 and discharging the stored charge to the touch sensing line 154.

The touch driving line 152 includes a plurality of first touch electrodes 152e, and first bridges 152b, which electrically interconnect the first touch electrodes 152e.

The first touch electrodes 152e are equidistantly spaced apart from each other in the Y-direction, which is a first direction, on the touch insulation layer 156. Each of the first touch electrodes 152e is electrically connected to an adjacent first touch electrode 152e via the first bridge 152b.

The first bridge 152b is disposed on the touch insulation layer 156 in the same plane as the first touch electrode 152e, and is electrically connected to the first touch electrode 152e without a separate contact hole.

The touch sensing line 154 includes a plurality of second touch electrodes 154e, and second bridges 154b, which electrically interconnect the second touch electrodes 154e.

The second touch electrodes 154e are equidistantly spaced apart from each other in the X-direction, which is a second direction, on the touch insulation layer 156. Each of the second touch electrodes 154e is electrically connected to an adjacent second touch electrode 154e via the second bridge 154b.

The second bridge 154b is formed on the second inorganic encapsulation layer 146 and is exposed through a touch contact hole 150, which is formed in the touch insulation layer 156, so as to be electrically connected to the second touch electrode 154e. The second bridge 154b is disposed so as to overlap the bank 128, in the same manner as the first bridge 152b, which may prevent damage to the aperture ratio due to the first and second bridges 152b and 154b.

In this way, the touch driving line 152 and the touch sensing line 154 of the present disclosure are connected respectively to a touch drive unit (not illustrated) via a routing line 160 and a touch pad 170, which are disposed in a non-active (bezel) area.

As such, the routing line 160 transmits a touch driving pulse generated in the touch drive unit to the touch driving line 152 via the touch pad 170, and also transmits a touch signal from the touch sensing line 154 to the touch pad 170.

The routing line 160 is disposed between each of the first and second touch electrodes 152e and 154e and the touch pad 170 to electrically interconnect these 152e, 154e and 170. The routing line 160 connected to the first touch electrode 152e, as illustrated in FIG. 2, extends to at least one of the upper side and the lower side of an active area so as to be connected to the touch pad 170. The routing line 160 connected to the second touch electrode 154e extends to at least one of the right side and the left side of the active area so as to be connected to the touch pad 170. The arrangement of the routing line 160 is not limited to the structure of FIG. 2, and may be changed in various ways according to design requirements of the display device.

A plurality of routing lines 160 is provided on different planes so as to overlap each other. In the present disclosure, the structure in which the routing lines 160 include lower and upper routing lines 162 and 164 disposed on different planes will be described by way of example.

The lower routing line 162 is formed by the same mask process as the second bridge 154b using the same material as the second bridge 154b. The lower routing line 162 is formed on the second inorganic encapsulation layer 146, which is the uppermost layer of the encapsulation unit 140, so as to cover the side surface of the encapsulation unit 140. Since the lower routing line 162 is protected by the touch insulation layer 156, it is possible to prevent damage to the lower routing line 162 when patterning the upper routing line 164, which results in increased reliability.

The upper routing line 164 is formed by the same mask process as the touch electrodes 152e and 154e using the same material as the touch electrodes 152e and 154e. The upper routing line 164 is disposed on the touch insulation layer 156, which is formed so as to cover the lower routing line 162, and is also formed to cover the side surface of the touch insulation layer 156. In addition, the upper routing line 164 is formed on the touch insulation layer 156 so as to extend along the lower routing line 162 and to have the same shape as the lower routing line 162. The upper routing line 164 extends from each of the first and second touch electrodes 152e and 154e, and overlaps the lower routing line 162 with the touch insulation layer 156 therebetween.

The upper routing line 164 is electrically connected to the lower routing line 162, which is exposed through a plurality of routing contact holes 166 formed in the touch insulation layer 156. The routing contact holes 166 may serve to increase connection areas between the upper routing line 164 and the lower routing line 162, and thus may prevent a connection fault between the upper routing line 164 and the lower routing line 162. In addition, since the routing line 160, which includes the upper routing line 164 and the lower routing line 162, is formed to have a multilayered structure, it is possible to reduce the resistance of the routing line 160. Moreover, since the routing line 160 has a multilayered structure, even if any one of the upper and lower routing lines 162 and 164 is disconnected, the other routing line may perform transmission of the touch driving pulse and the touch signal.

The touch pad 170 is formed so as to be exposed outwards by a touch protective layer 190, and thus is connected to a signal transmission film on which the touch drive unit (not illustrated) is mounted. The touch pad 170 may be disposed in at least one of one side area and the other side area of the substrate 111, together with a display pad (not illustrated)

connected to at least one of the data line DL, the scan line SL, the low-voltage (VSS) supply line, and the high-voltage (VDD) supply line. Alternatively, the touch pad 170 and the display pad may be disposed in different non-active areas. Meanwhile, the arrangement of the touch pad 170 is not limited to the structure of FIG. 2, and may be changed in various ways according to necessary design requirements of the display device.

The touch pad 170 is disposed on at least one layer 116 among a plurality of insulation layers 102, 104, 114, 116 and 118 disposed below the light-emitting element 120. The touch pad 170 includes a lower pad electrode 172 extending from the lower routing line 162 and an upper pad electrode 174 extending from the upper routing line 164.

The lower pad electrode 172 is formed by the same mask process as the second bridge 154b using the same material as the second bridge 154b. The lower pad electrode 172 extends from the lower routing line 162 on the protective layer 116, and thus, is directly connected to the lower routing line 162.

The upper pad electrode 174 is formed by the same mask process as the touch electrodes 152e and 154e using the same material as the touch electrodes 152e and 154e. The upper pad electrode 174 is electrically connected to the lower pad electrode 172, which is exposed through a pad contact hole 176 formed in the touch insulation layer 156.

In this way, in the present disclosure, each of the first and second touch electrodes 152e and 154e, the first and second bridge 152b and 154b, the upper routing line 164, and the upper pad electrode 174 is formed of the transparent conductive layer 161 and the opaque conductive layer 163 disposed on or beneath the transparent conductive layer 161. The transparent conductive layer 161 is formed in a single layer or in multiple layers using at least one of ITO, IZO, ZnO, IGZO, and ITO/Ag/ITO. The opaque conductive layer 163 is formed in a single layer or in multiple layers using a highly conductive material having strong corrosion resistance and acid resistance, such as Al, Ti, Cu, and Mo. For example, the opaque conductive layer 163 is formed in a triple-layered structure as a stack of Ti/Al/Ti or Mo/Al/Mo.

The transparent and opaque conductive layers 161 and 163 of each of the upper routing line 164 and the upper pad electrode 174 are formed to have the same shape. That is, the opaque conductive layer 163 of each of the upper routing line 164 and the upper pad electrode 174 is formed on the transparent conductive layer 161 of each of the upper routing line 164 and the upper pad electrode 174 so as to have the same shape and the same line width as those of the transparent conductive layer 161.

The opaque conductive layer 163 of each of the first and second touch electrodes 152e and 154e and the first and second bridges 152b and 154b is formed to have a line width smaller than that of the transparent conductive layer 161 of each of the first and second touch electrodes 152e and 154e and the first and second bridges 152b and 154b. That is, the opaque conductive layer 163 of each of the first and second touch electrodes 152e and 154e and the first and second bridges 152b and 154b is formed on the transparent conductive layer 161 to have a mesh shape. The opaque conductive layer 163 has conductivity higher than that of the transparent conductive layer 161, so that the first and second touch electrodes 152e and 154e may be formed as low-resistance electrodes. Thereby, the resistance and the capacitance of the first and second touch electrodes 152e and 154e may be reduced, which may result in a reduced RC time constant and increased touch sensitivity. In addition, since the mesh-shaped opaque conductive layer 163 has a very small line width, it is possible to prevent deterioration in the aperture ratio and transmissivity due to the mesh-shaped opaque conductive layer 163.

FIGS. 4A to 8B are plan views and cross-sectional views for explaining a method of manufacturing the organic light-emitting diode display device having the touch sensor illustrated in FIGS. 2 and 3.

Figure 4A:
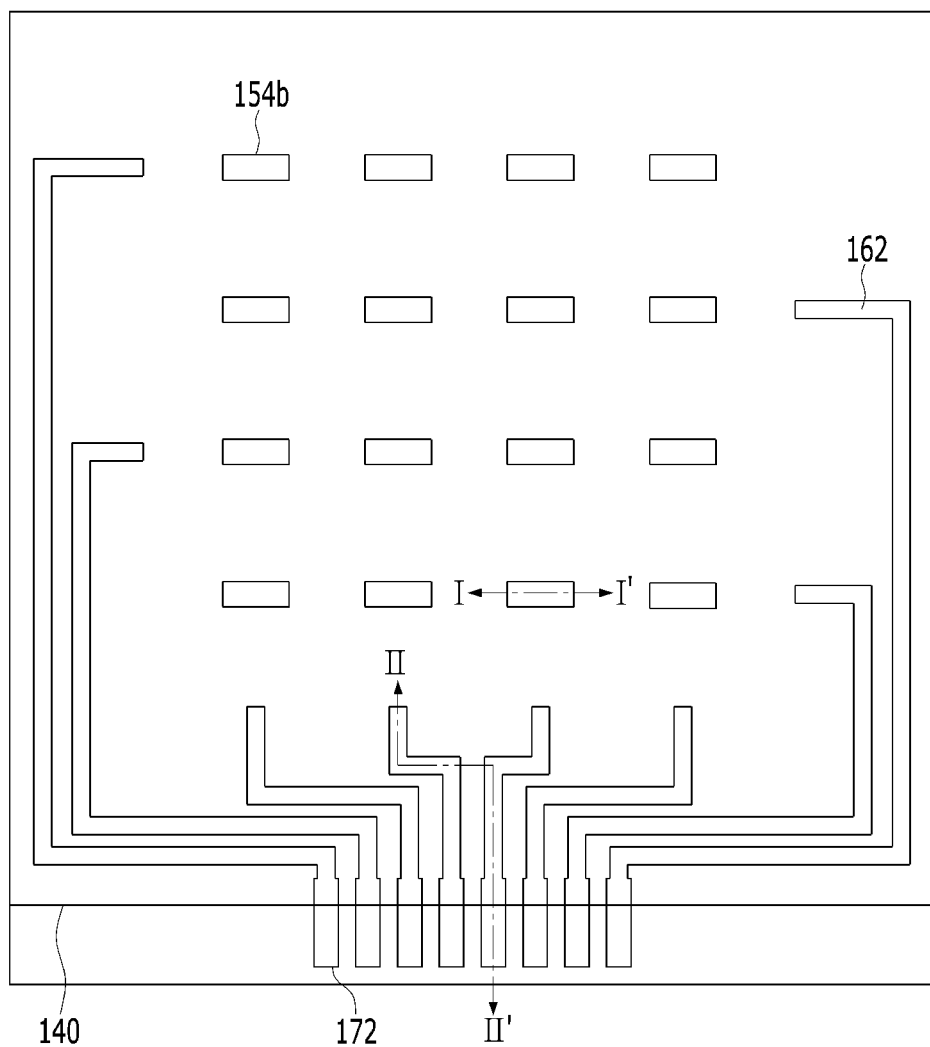
FIGS. 4A and 4B are a plan view and a cross-sectional view respectively for explaining a method of manufacturing a second bridge, a lower routing line, and a lower pad electrode illustrated in FIGS. 2 and 3.
Figure 4B:
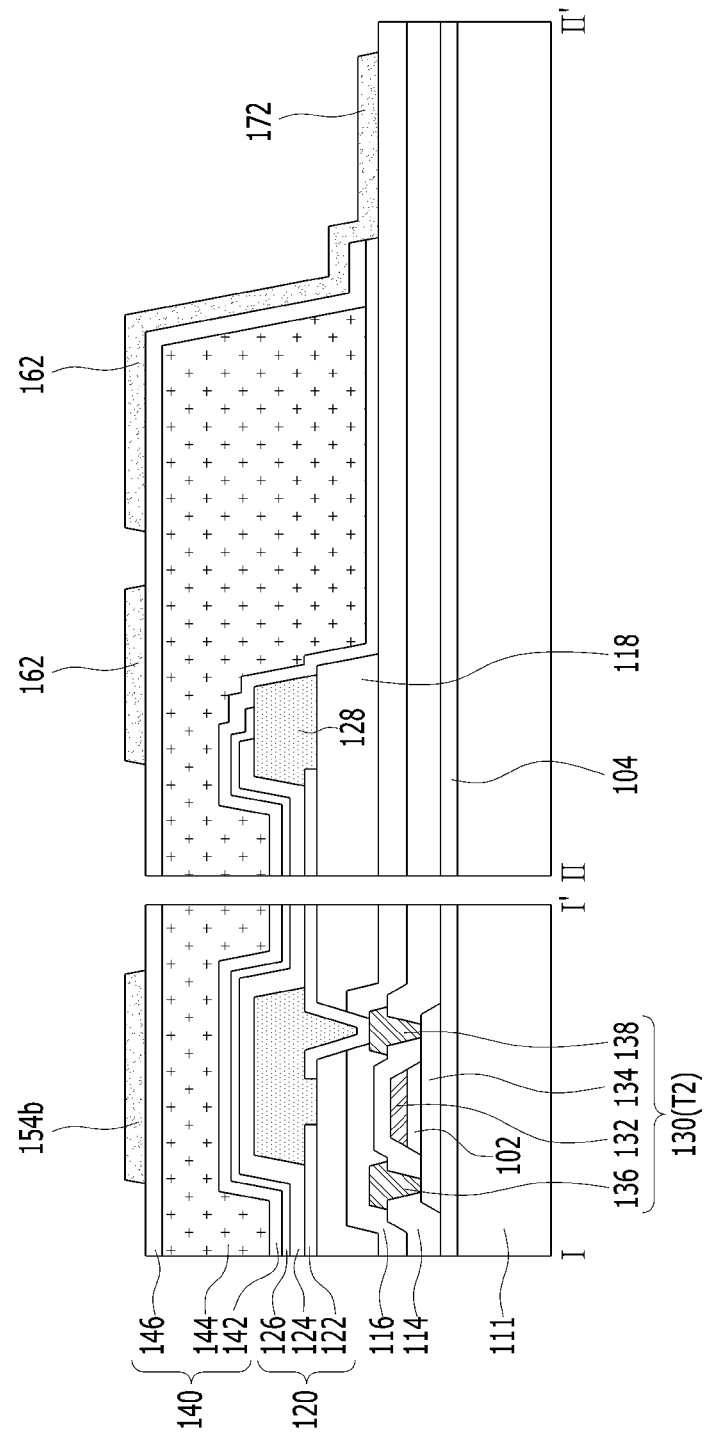

Referring to FIGS. 4A and 4B, the second bridge 154b, the lower routing line 162, and the lower pad electrode 172 are formed on the substrate 111 having the switching transistor T1, the driving transistor T2 or 130, the light-emitting element 120, and the encapsulation unit 140 formed thereon.

Specifically, a conductive layer is deposited on the entire surface of the substrate 111, having the switching transistor T1, the driving transistor T2 or 130, the light-emitting element 120, and the encapsulation unit 140 formed thereon, by a deposition process. Subsequently, the conductive layer is patterned by a photolithography process and an etching process using a first mask, whereby the second bridge 154b, the lower routing line 162, and the lower pad electrode 172 are formed. Here, each of the second bridge 154b, the lower routing line 162, and the lower pad electrode 172 is formed in a single layer or in multiple layers using a having good conductivity, and strong corrosion resistance and acid resistance, such as Al, Ag, Ti, Cu, Mo, and MoTi. For example, each of the second bridge 154b, the lower routing line 162, and the lower pad electrode 172 is formed in a triple-layered structure as a stack of Ti/Al/Ti or Mo/Al/Mo.

Figure 5A:
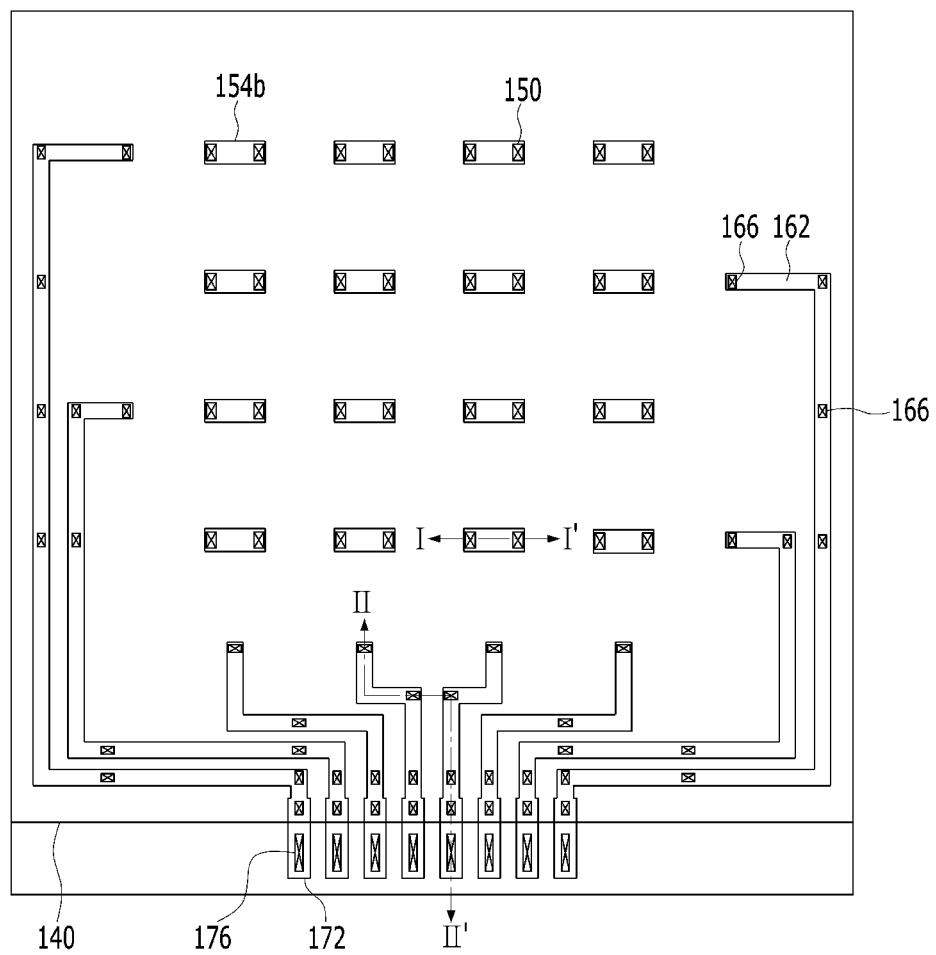
FIGS. 5A and 5B are a plan view and a cross-sectional view for explaining a method of manufacturing a touch contact hole, a routing contact hole, and a pad contact hole illustrated in FIGS. 2 and 3.
Figure 5B:
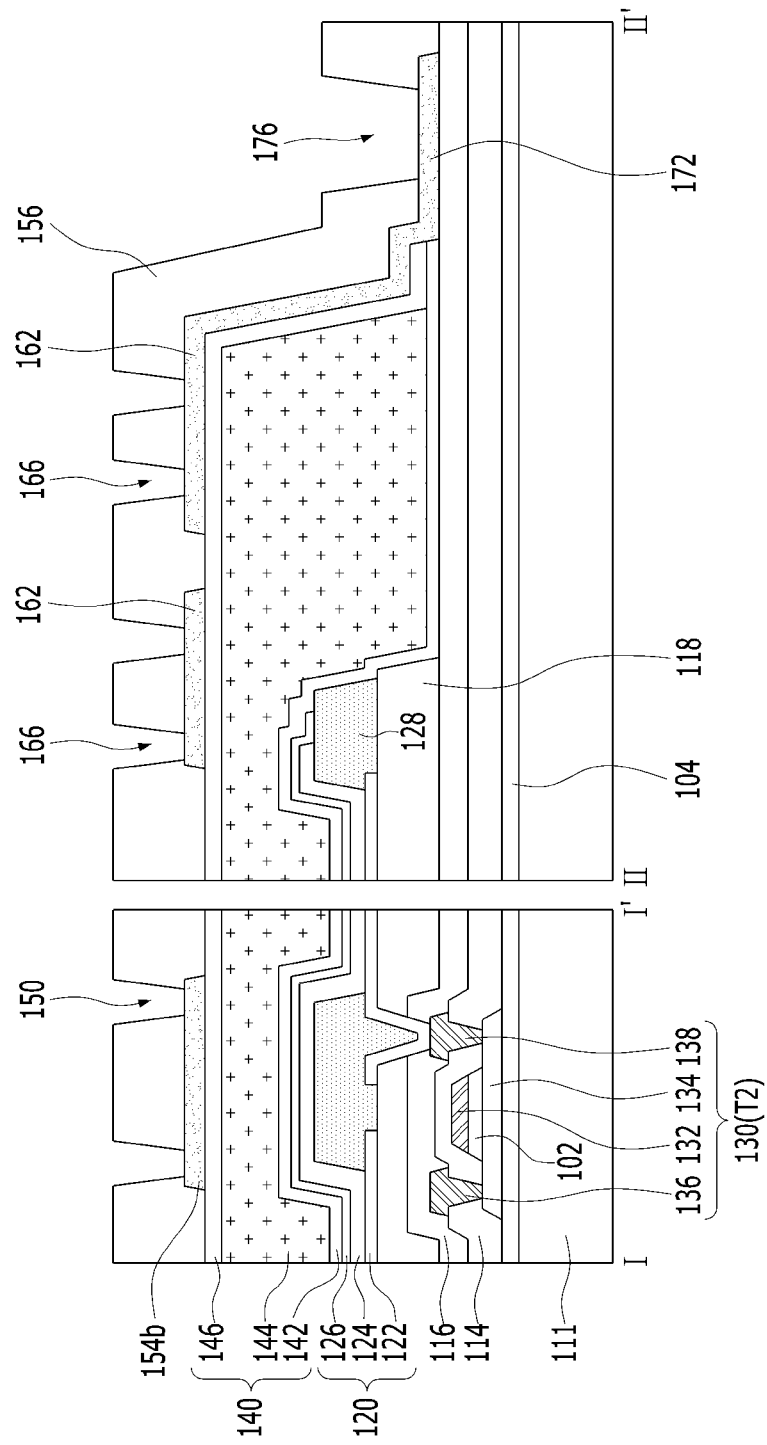

Referring to FIGS. 5A and 5B, the touch insulation layer 156, which includes the touch contact hole 150, the routing contact hole 166, and the pad contact hole 176, is formed on the substrate 111 having the second bridge 154b, the lower routing line 162, and the lower pad electrode 172 formed thereon.

Specifically, the touch insulation layer 156 is formed by depositing an inorganic or organic insulation material on the substrate 111 having the second bridge 154b, the lower routing line 162, and the lower pad electrode 172 formed thereon. Here, the touch insulation layer 156 may be an inorganic layer such as $SiN_x$, SiON, and $SiO_2$, or may be an acryl-based, epoxy-based, Parylene-C, Parylene-N, Parylene-F, or siloxane-based organic layer. Subsequently, the touch insulation layer 156 is patterned by a photolithography process and an etching process using a second mask, whereby the touch contact hole 150, the routing contact hole 166, and the pad contact hole 176 are formed.

Figure 6A:
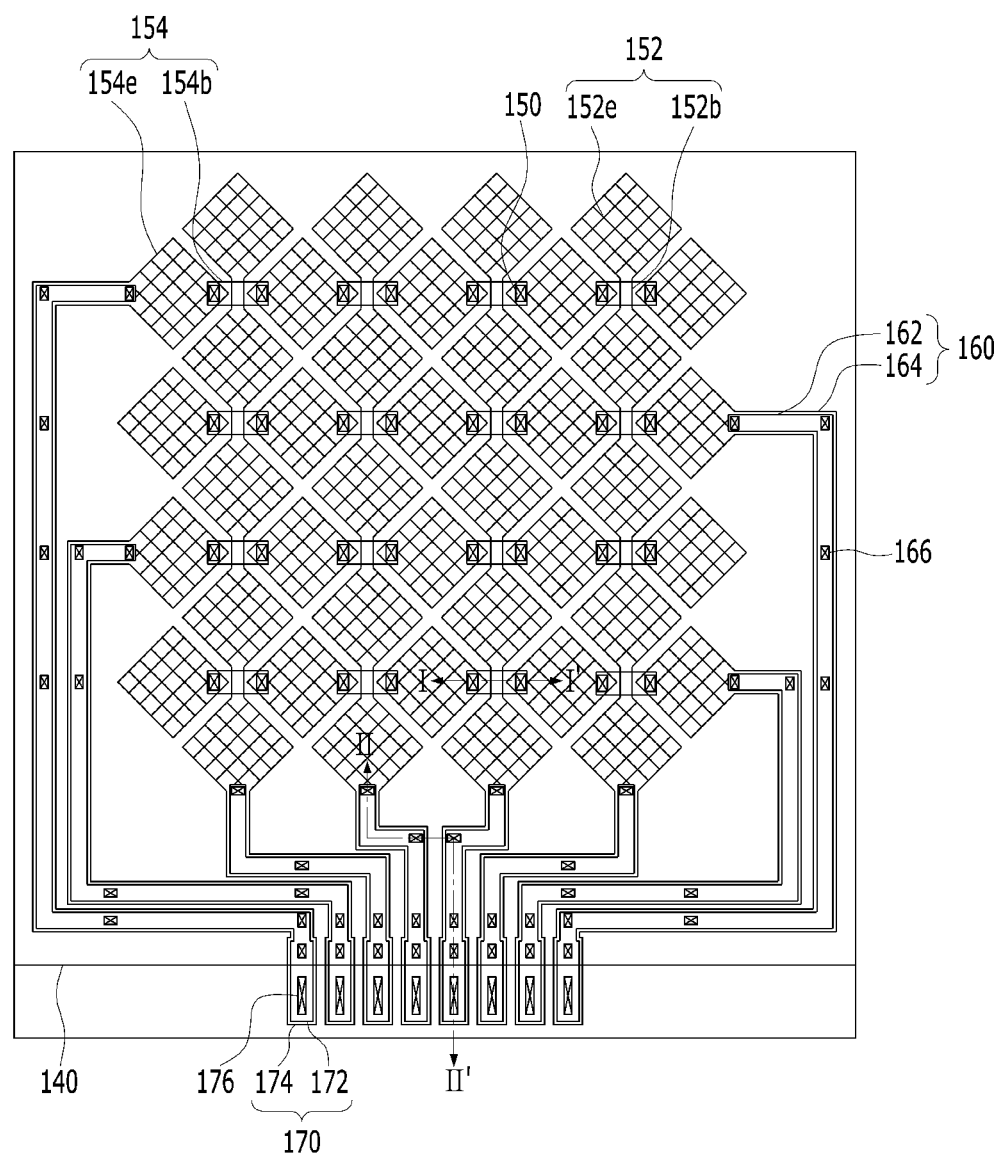
FIGS. 6A and 6B are a plan view and a cross-sectional view for explaining a method of manufacturing first and second touch electrodes, a first bridge, an upper routing line, and an upper pad electrode illustrated in FIGS. 2 and 3.
Figure 6B:
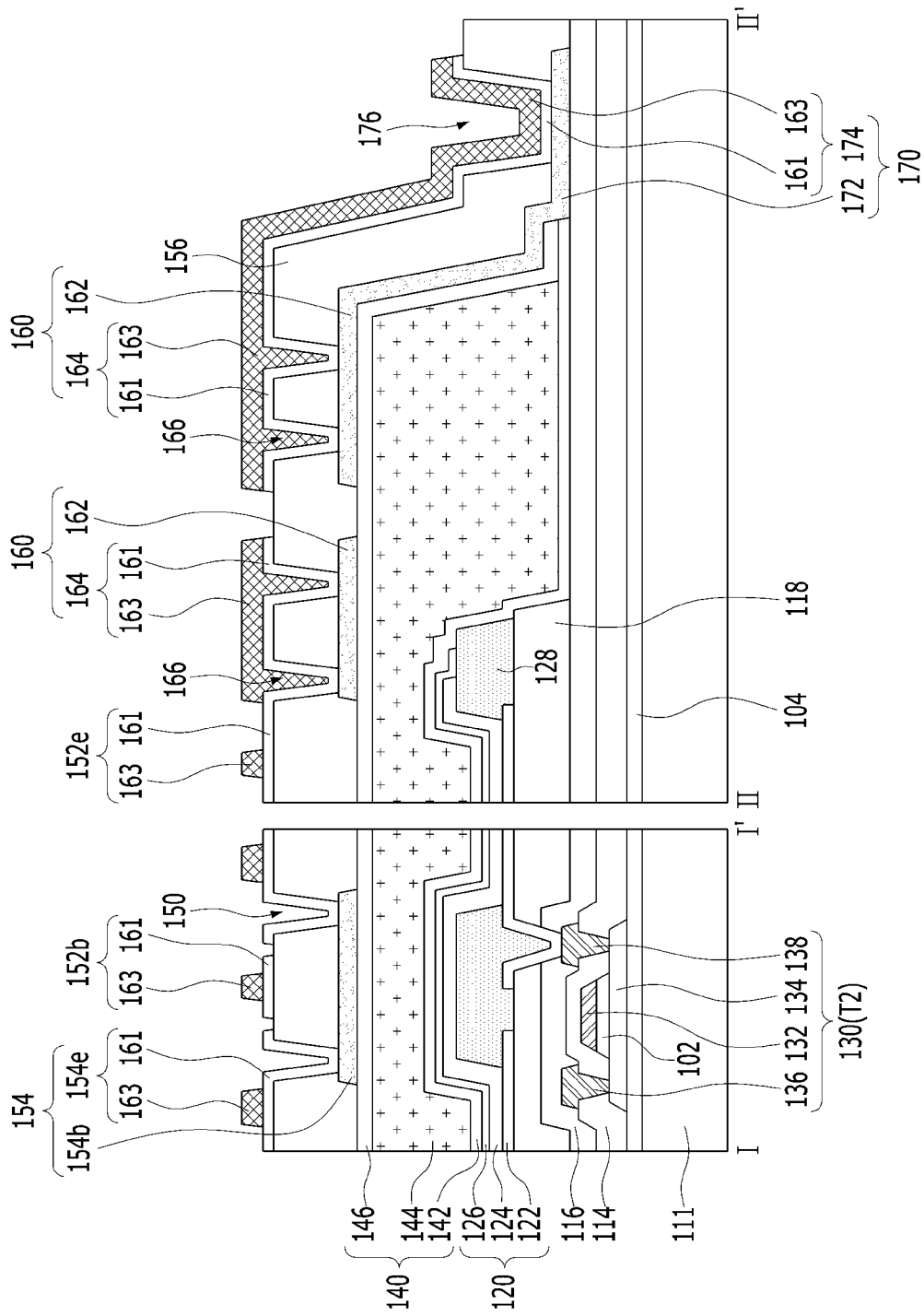

Referring to FIGS. 6A and 6B, the first and second touch electrodes 152e and 154e, the first bridge 152b, the upper routing line 164, and the upper pad electrode 174 are formed on the substrate 111 having the touch contact hole 150, the routing contact hole 166, and the pad contact hole 176 formed thereon. This will be described below with reference to FIGS. 7A to 7D.

Figure 7A:
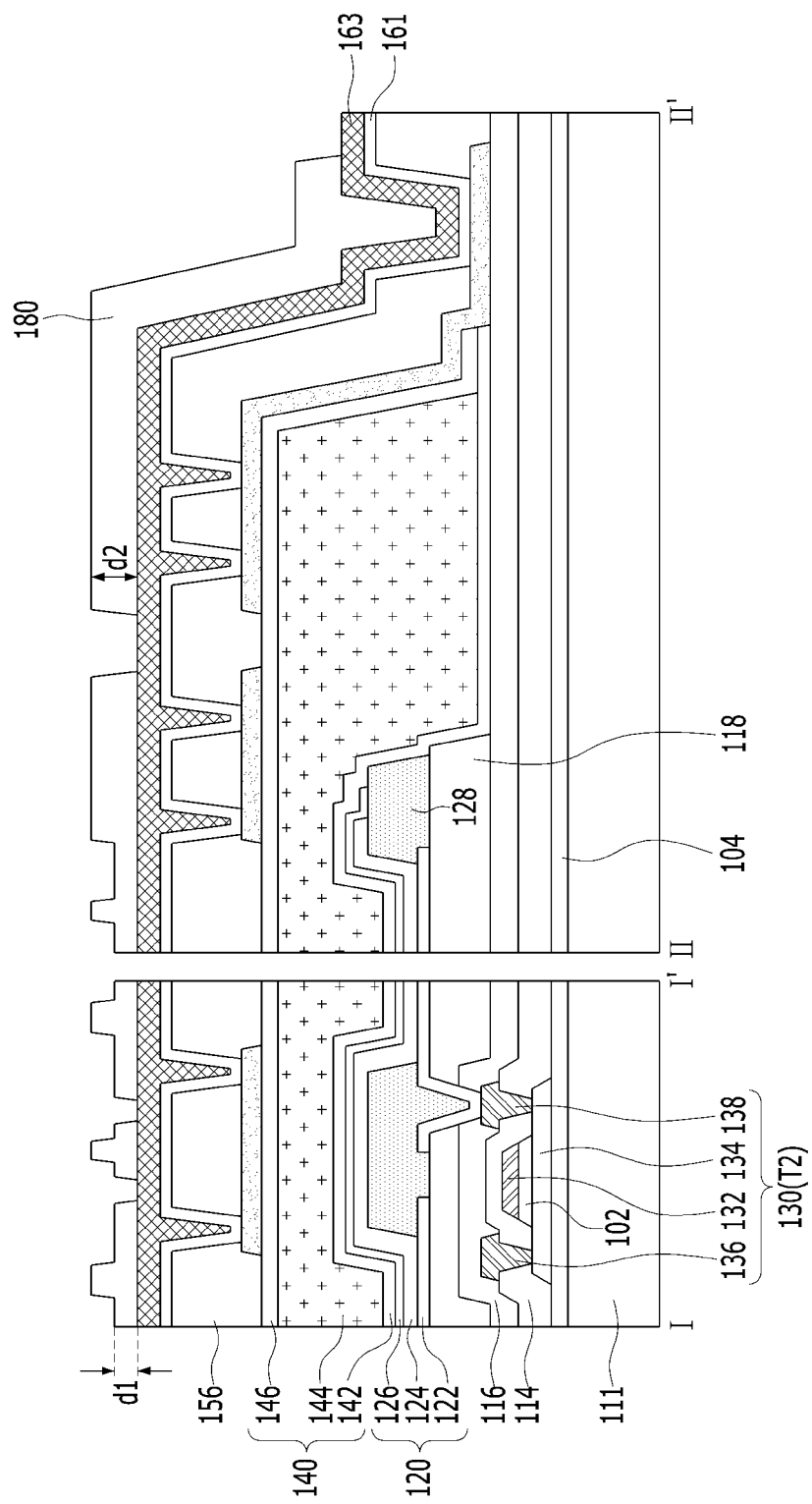
FIGS. 7A to 7D are cross-sectional views for explaining the method of manufacturing the first and second touch electrodes, the first bridge, the upper routing line, and the upper pad electrode illustrated in FIG. 6B in detail.

As illustrated in FIG. 7A, the transparent conductive layer 161 and the opaque conductive layer 163 are sequentially laminated on the substrate 111 having the touch contact hole 150, the routing contact hole 166, and the pad contact hole 176 formed thereon. Here, the transparent conductive layer 161 is formed of a transparent conductive layer, such as ITO, IZO, ZnO, IGZO, and ITO/Ag/ITO, and the opaque conductive layer 163 is formed in a single layer or in multiple layers using a having good conductivity, and strong corrosion resistance and acid resistance, such as Al, Ag, Ti, Cu, Mo, and MoTi. For example, the opaque conductive layer 163 is formed in a triple-layered structure as a stack of Ti/Al/Ti or Mo/Al/Mo.

Subsequently, after a photosensitive layer is laminated on the opaque conductive layer 163, the photosensitive layer is patterned by a photolithography process using a third mask, such as a half-tone mask or a slit mask, whereby a photosensitive layer 180 having a multilayered structure is formed. The multilayered photosensitive layer 180 is formed to have a second thickness d2 in the area in which the mesh-shaped opaque conductive layer 163 of each of the first and second touch electrodes 152e and 154e and the first bridge 152b, the upper routing line 164, and the upper pad electrode 174 are formed, and is also formed to have a first thickness in the area in which the transparent conductive layer 161 is formed so as to be exposed by the mesh-shaped opaque conductive layer 163 of each of the first and second touch electrodes 152e and 154e and the first bridge 152b. The photosensitive layer 180 is not formed in the remaining area.

Figure 7B:
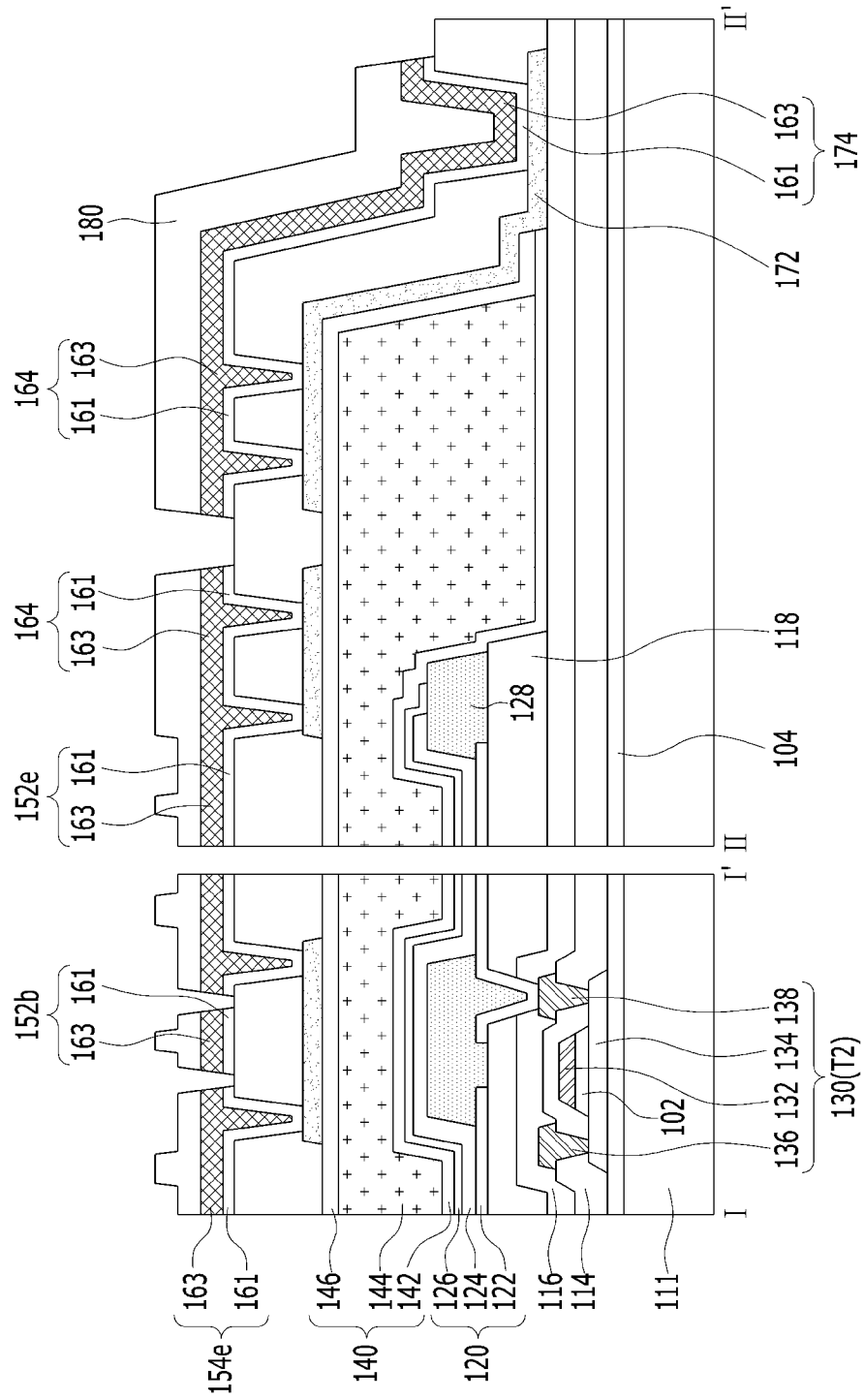

The opaque conductive layer 163 and the transparent conductive layer 161 are etched through an etching process using the multilayered photosensitive layer 180 as a mask. Thereby, as illustrated in FIG. 7B, each of the first and second touch electrodes 152e and 154e, the first bridge 152b, the upper routing line 164, and the upper pad electrode 174 is formed to have a multilayered structure that includes the transparent and opaque conductive layers 161 and 163 having the same line width.

Figure 7C:
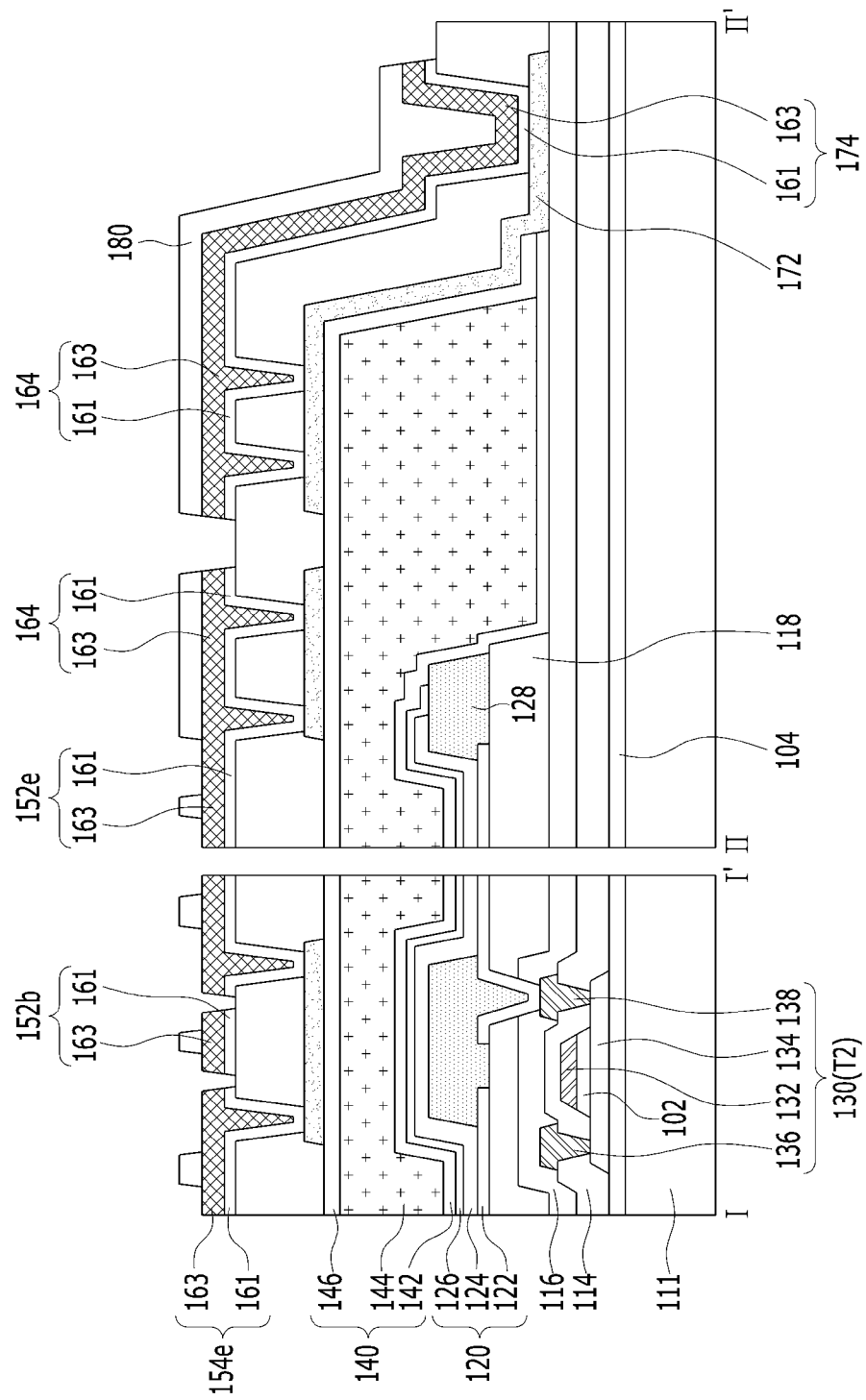
Figure 7D:
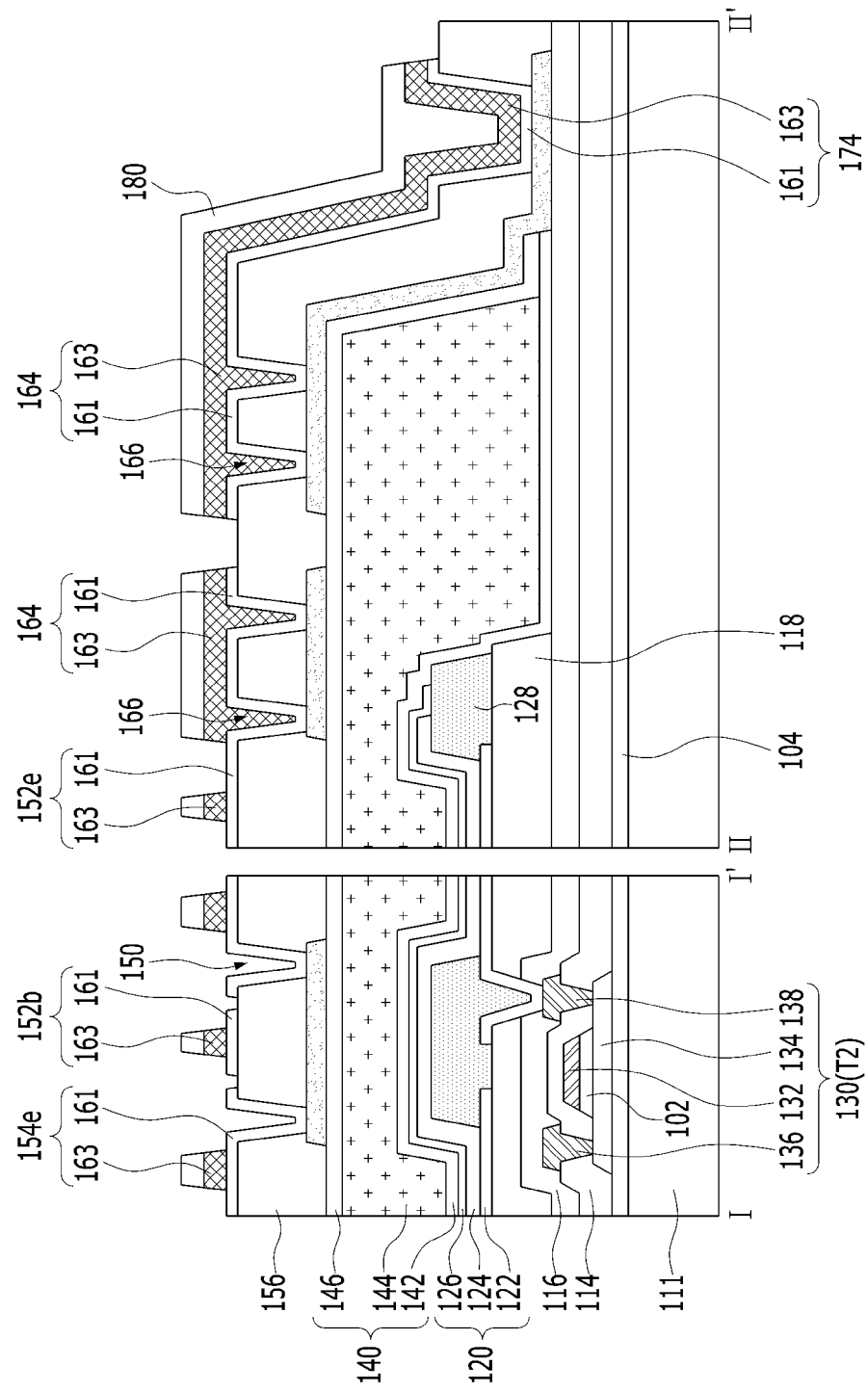

Subsequently, by ashing the multilayered photosensitive layer 180, as illustrated in FIG. 7C, the total thickness of the photosensitive layer 180 is reduced such that a portion of the photosensitive layer 180, which has the first thickness, is removed, whereby the opaque conductive layer 163 of each of the first and second touch electrodes 152e and 154e and the first bridge 152b is exposed. Subsequently, when the exposed opaque conductive layer 163 is removed through an etching process using the multilayered photosensitive layer 180, subjected to ashing, as a mask, as illustrated in FIG. 7D, the transparent conductive layer 161 of each of the first and second touch electrodes 152e and 154e and the first bridge 152b is exposed. Subsequently, the photosensitive layer 180 remaining on the substrate is removed through a stripping process, as illustrated in FIG. 6B.

Figure 8A:
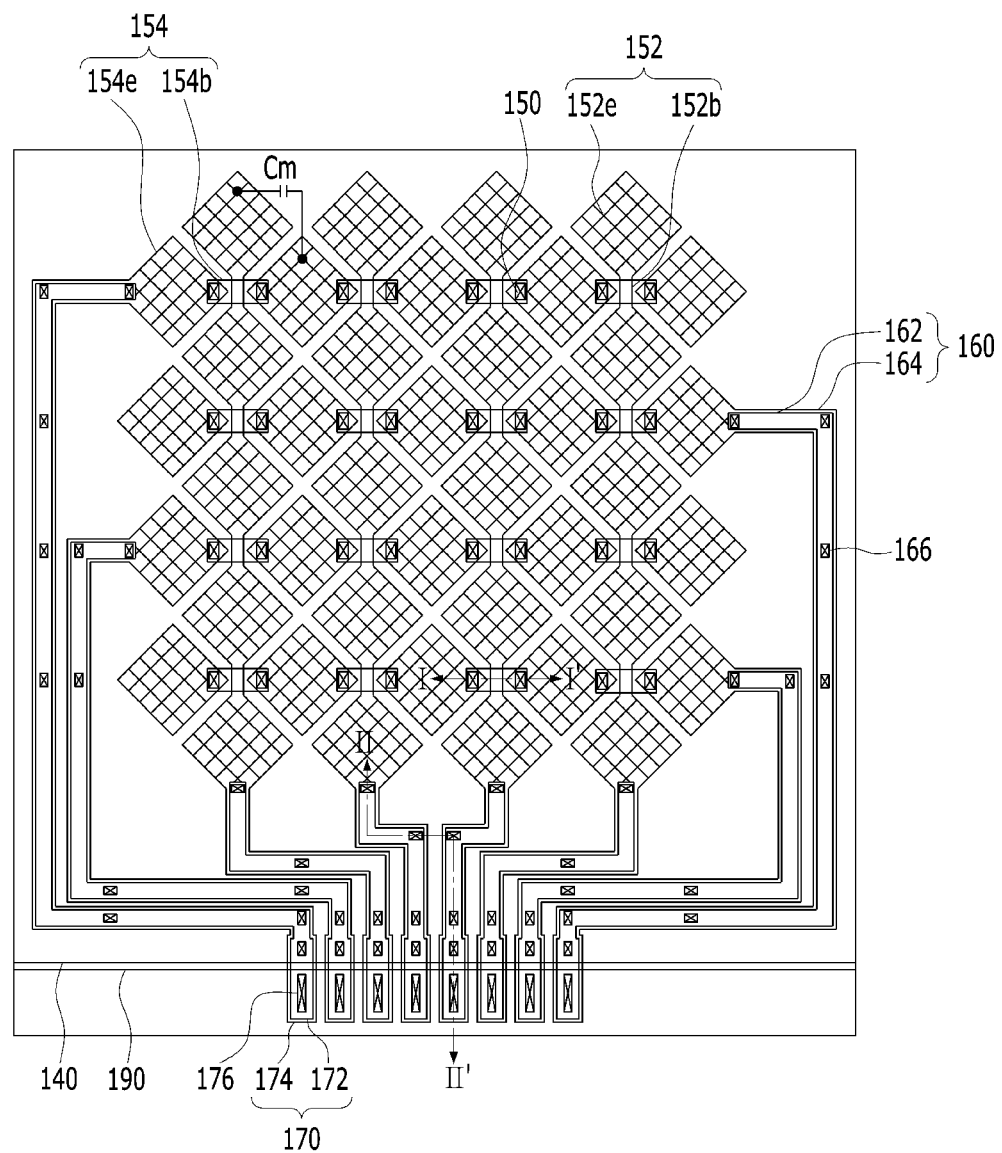
FIGS. 8A and 8B are a plan view and a cross-sectional view for explaining a method of manufacturing a touch protective layer illustrated in FIGS. 2 and 3.
Figure 8B:
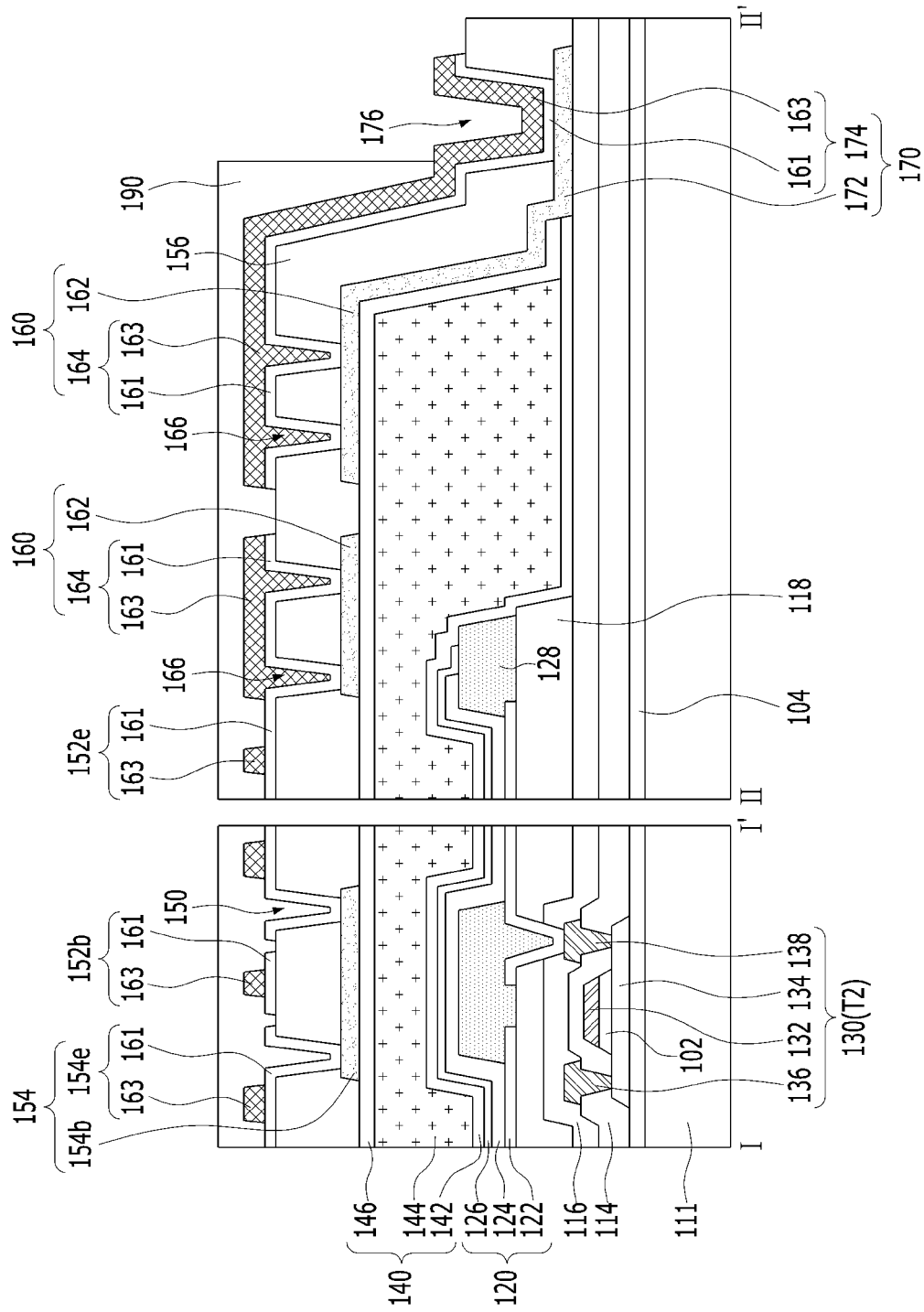

Referring to FIGS. 8A and 8B, the touch protective layer 190 is formed on the substrate 111 having the first and second touch electrodes 152e and 154e, the first bridge 152b, the upper routing line 164, and the upper pad electrode 174 formed thereon.

Specifically, an organic insulation material, such as a photo-acryl-based resin, is applied to the entire surface of the substrate 111 having the first and second touch electrodes 152e and 154e, the first bridge 152b, the upper routing line 164, and the upper pad electrode 174 formed thereon. Subsequently, the organic insulation material is patterned by a photolithography process and an etching process using a fourth mask. Thereby, as illustrated in FIG. 8B, the touch protective layer 190 is formed so as to expose the touch pad 170.

In this way, in the display panel according to the present disclosure, the transparent conductive layer 161 and the mesh-shaped opaque conductive layer 163, which are included in each of the touch electrodes 152e and 154e, are formed through the same mask process. Thereby, the present disclosure may achieve a simplified process and reduced costs owing to a reduced number of mask processes.

Figure 9:
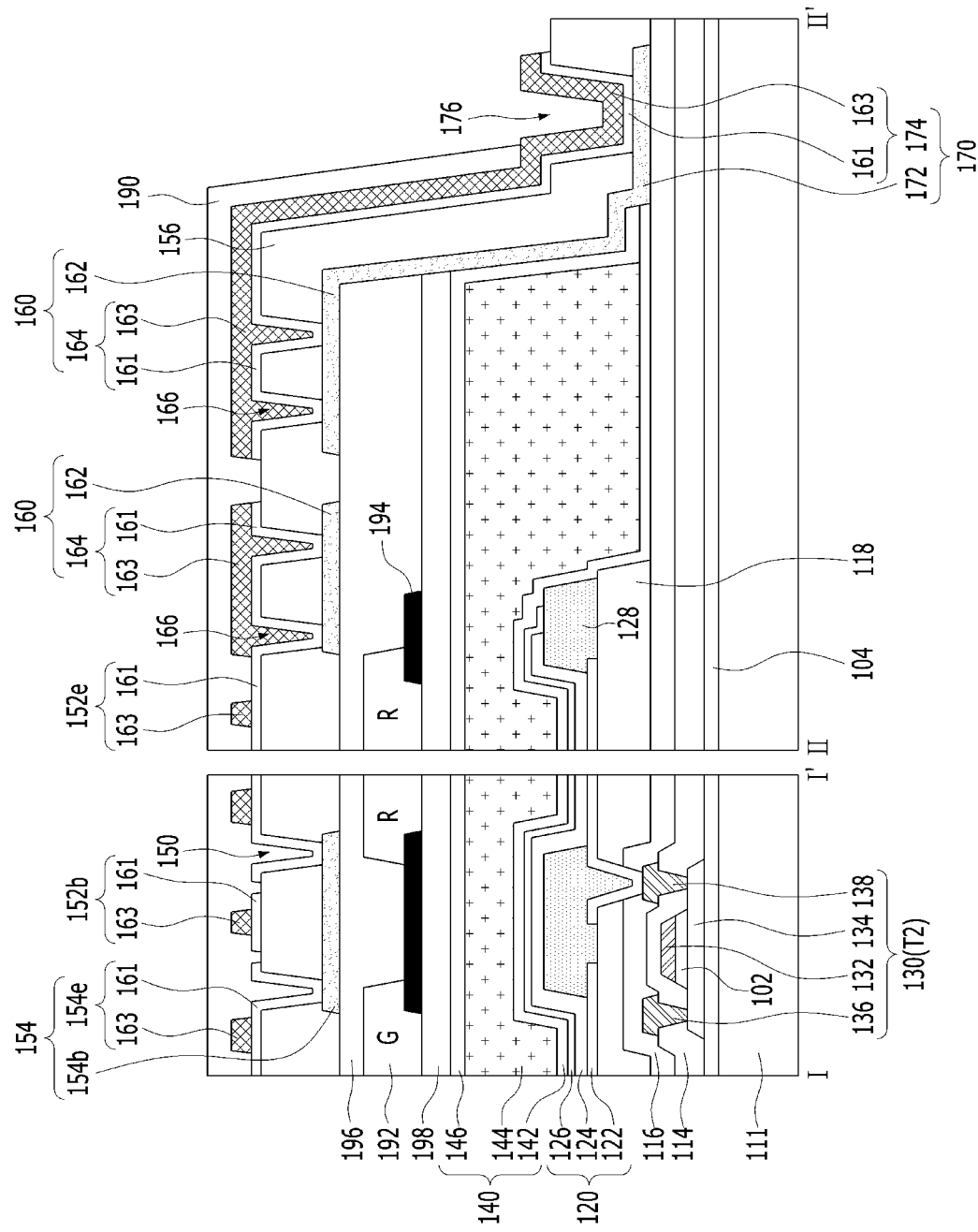
FIG. 9 is a cross-sectional view illustrating an organic light-emitting diode display device having a touch sensor according to another aspect of the present disclosure.

FIG. 9 is a cross-sectional view illustrating an organic light-emitting diode display device according to another aspect of the present disclosure.

The organic light-emitting diode display device illustrated in FIG. 9 includes the same constituent elements as those of the organic light-emitting diode display device illustrated in FIG. 3, except that it further includes color filters 192 disposed between the encapsulation unit 140 and the touch electrodes 152e and 154e. Thus, a detailed description related to the same constituent elements will be omitted below.

The color filters 192 are formed between each of the touch sensing line 154 and the touch driving line 152 and the light-emitting element 120. The distance between each of the touch sensing line 154 and the touch driving line 152 and the light-emitting element 120 is increased by the color filters 192. Thereby, the capacitance of a parasitic capacitor formed between each of the touch sensing line 154 and the touch driving line 152 and the light-emitting element 120 may be minimized, and mutual interaction due to coupling between each of the touch sensing line 154 and the touch driving line 152 and the light-emitting element 120 may be prevented. In addition, the color filters 192 may prevent a chemical solution (e.g., developing solution or etching solution) used in the process of manufacturing the touch sensing line 154 and the touch driving line 152, external moisture, and the like from entering the light-emitting stack 124. Thereby, the color filters 192 may prevent damage to the light-emitting stack 124, which is vulnerable to the chemical solution or moisture. Meanwhile, as illustrated in FIG. 9, the configuration in which the touch electrodes 152e and 154e are disposed over the color filters 192 has been described by way of example, but the color filters 192 may be disposed over the touch electrodes 152e and 154e. In this case, the touch electrodes 152e and 154e are disposed between the color filters 192 and the encapsulation unit 140.

A black matrix 194 is disposed between the color filters 192. The black matrix 194 serves to separate the respective subpixel areas from each other and to prevent optical interference and light leakage between adjacent subpixel areas. The black matrix 194 may be formed of a high-resistance black insulation material, or may be formed by stacking at least two colors of color filters among red (R), green (G), and blue (B) color filters 192. In addition, a touch planarization layer 196 is formed on the substrate 111 having the color filters 192 and the black matrix 194 formed thereon. The substrate 111 having the color filters 192 and the black matrix 194 formed thereon is flattened by the touch planarization layer 196.

Figure 10:
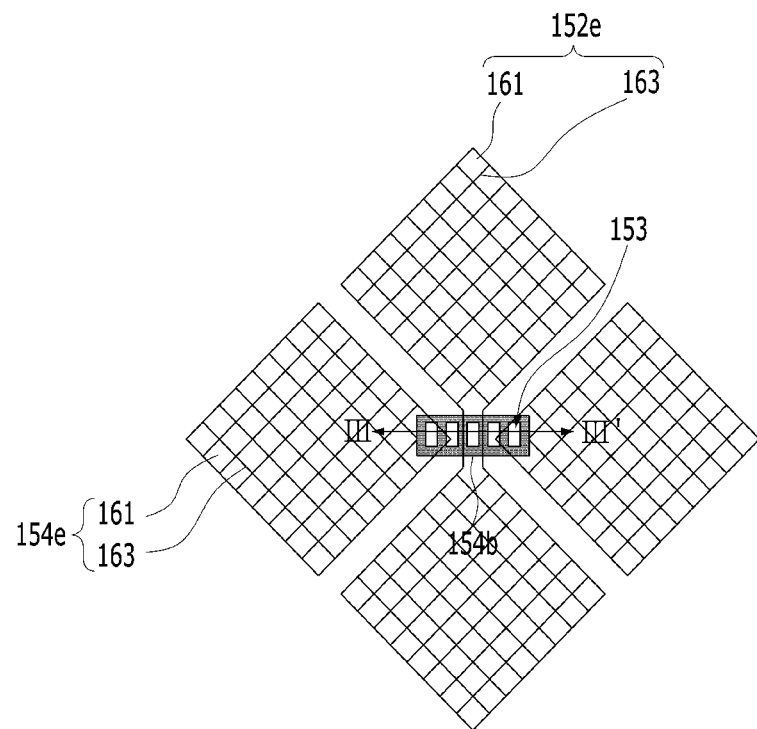
FIG. 10 is a plan view and a cross-sectional view illustrating another form of the bridges in the organic light-emitting diode display device having a touch sensor according to the present disclosure.
Figure 10:
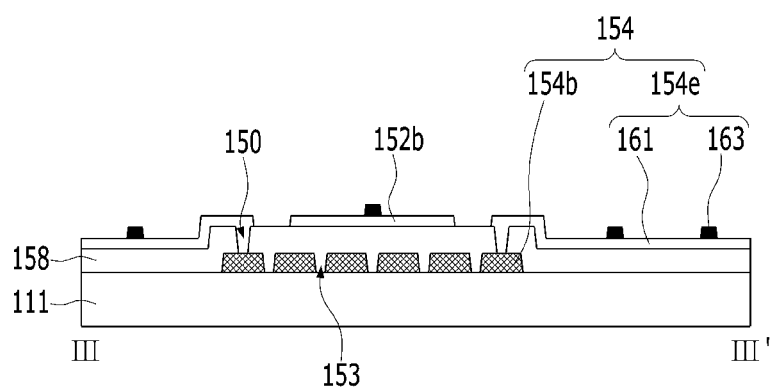

Meanwhile, in the present disclosure, the first and second bridges 152b and 154b may include a plurality of slits 153, as illustrated in FIG. 10. The second bridge 154b having the slits 153, illustrated in FIG. 10, may have a reduced surface area, compared to the second bridge 154b having no slit 153 illustrated in FIG. 3. Thereby, the reflection of external light by the second bridge 154b may be reduced, which may prevent deterioration in visibility. In addition, in the present disclosure, the mutual-capacitance-type touch sensor, which is formed between the touch sensing line 154 and the touch driving line 152 intersecting each other, has been described by way of example, the present disclosure may also be applied to a self-capacitance-type touch sensor Cs.

As is apparent from the above description, in a display device according to the present disclosure, a plurality of routing lines, which are connected respectively to a plurality of touch sensors, are disposed on different planes so as to overlap each other and are electrically connected to each other through a plurality of routing contact holes. Thereby, according to the present disclosure, it is possible to prevent a connection fault between the routing lines. In addition, in the present disclosure, a transparent conductive layer and a mesh-shaped opaque conductive layer, which are included in each touch electrode, are formed through the same mask process. Thereby, it is possible to simplify a manufacturing process and to reduce costs, through reduction in the number of mask processes. Moreover, a conventional organic light-emitting diode display device includes a touchscreen attached thereto using an adhesive, whereas an organic light-emitting diode display device of the present disclosure includes touch electrodes disposed on an encapsulation unit, which may make a separate attachment process be unnecessary, resulting in a simplified manufacturing process and reduced costs.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure.

What is claimed is:

1. A display device comprising:
    a light-emitting element disposed on a substrate having an active area and a non-active area,
    an encapsulation unit disposed on the light-emitting element, wherein the encapsulation unit comprises a plurality of inorganic encapsulation layers and at least one organic encapsulation layer,
    first and second touch electrodes and first and second bridges disposed above the encapsulation unit; and
    first and second routing lines respectively electrically connected to the first touch electrode or second touch electrode and disposed along a side surface of the inorganic encapsulation layer covering a side surface of the organic encapsulation layer,
    wherein the first and second routing lines are disposed on different planes so as to overlap each other and are electrically connected to each other through a routing contact hole in the non-active area.

2. The display device according to claim 1, wherein the first routing line is disposed on a same layer as one of the first and second bridges, and the second routing line is disposed on a same layer as one of the first and second touch electrodes.

3. The display device according to claim 1, wherein the non-active area includes in a pad area and at least one of dam, the at least one of dam is disposed between the active area and the pad area.

4. The display device according to claim 3,
    wherein the first and second routing lines comprise:
    a lower routing line disposed on the encapsulation unit; and
    an upper routing line connected to the lower routing line through the plurality of routing contact holes penetrating a touch insulating film disposed to cover the lower routing line, and
    wherein the upper routing line is disposed along the lower routing line on the touch insulating film.

5. The display device according to claim 4,
    wherein the first touch electrodes are arranged in a first direction on the encapsulation unit; and
    the first bridge interconnects the plurality of first touch electrodes each other,
    the second touch electrodes are arranged in a second direction, which is different from the first direction; and
    the second bridge interconnects the plurality of second touch electrodes each other,
    wherein the lower routing line is made of the same material as any one of the first and second bridges, and
    wherein the upper routing line extends from each of the first and second touch electrodes.

6. The display device according to claim 4, further comprising:
    a touch pad extending from the first and second routing lines and disposed on at least one of a plurality of insulating films in the pad area, which are disposed under the light-emitting element,
    wherein the touch pad comprises:
    a lower pad electrode extending from the lower routing line; and
    an upper pad electrode extending from the upper routing line.

7. The display device according to claim 6,
    wherein at least one of the upper routing line, the upper pad electrode, the first bridge, and the first and second touch electrodes comprises a transparent conductive layer and an opaque conductive layer disposed on the transparent conductive layer,
    wherein the transparent conductive layer is formed in at least one-layer structure including at least one of ITO, IZO, ZnO and IGZO, and
    wherein the opaque conductive layer is formed in at least one-layer structure including at least one of Ti, Al, Mo, MoTi, Cu and Ta.

8. The display device according to claim 7,
    wherein the opaque conductive layer of each of the upper routing line and the upper pad electrode are disposed on or beneath the transparent conductive layer and has a same shape as the transparent conductive layer.

9. The display device according to claim 7,
    wherein the opaque conductive layer of the first and second touch electrodes and the first bridge is formed on the transparent conductive layer with a smaller line width than that of the opaque conductive layer.

10. The display device according to claim 9,
    wherein at least one opaque conductive layer of the first and second touch electrodes and the first and second bridges has a mesh shape.

11. The display device according to claim 1,
    wherein at least one of the first and second bridges comprises at least one slit.

12. The display device according to claim 1, further comprising a color filter disposed between the encapsulation unit and at least one of the first touch electrode, the second touch electrode, the first bridge and the second bridge.

* * * * *